United States Patent [19]

Kinsman

[11] Patent Number: 5,107,328
[45] Date of Patent: Apr. 21, 1992

[54] PACKAGING MEANS FOR A SEMICONDUCTOR DIE HAVING PARTICULAR SHELF STRUCTURE

[75] Inventor: Larry Kinsman, Boise, Id.
[73] Assignee: Micron Technology, Inc., Boise, Id.
[21] Appl. No.: 655,494
[22] Filed: Feb. 13, 1991
[51] Int. Cl.$^5$ .................. H01L 23/04; H01L 23/06; H01L 23/08
[52] U.S. Cl. ......................... 357/74; 357/68
[58] Field of Search ............. 357/74, 80, 68; 174/52.4

[56] References Cited

U.S. PATENT DOCUMENTS

| | | | |
|---|---|---|---|
| 4,067,040 | 1/1978 | Tsuzuki et al. | 357/74 |
| 4,340,902 | 7/1982 | Honda et al. | 357/74 |
| 4,724,472 | 2/1988 | Sugimoto | 357/74 |
| 4,751,482 | 6/1989 | Fukuta et al. | 357/74 |
| 4,843,188 | 6/1989 | Patterson | 357/74 |
| 4,862,245 | 8/1989 | Pashby et al. | 357/70 |
| 4,887,149 | 12/1989 | Romano | 357/74 |
| 4,910,584 | 3/1990 | Mizuo | 357/74 |
| 4,926,242 | 5/1990 | Itoh et al. | 357/80 |
| 5,032,897 | 7/1991 | Mansuria et al. | 357/74 |

*Primary Examiner*—Rolf Hille
*Assistant Examiner*—S. V. Clark
*Attorney, Agent, or Firm*—Stanley N. Protigal

[57] ABSTRACT

A ceramic or plastic body has a shelf comprising conductive traces. A semiconductor die is attached to the underside of the shelf, or to a base of the body. A void or voids in said shelf allows the passage of bond wires to couple the bond pads of the inferiorly positioned semiconductor die with said conductive traces. Manufacturable from ceramic, plastic, or any workable material, various described embodiments of the invention alleviate the need for a lead frame while being usable with a die having bond pads located either centrally or laterally. The invention can receive die of various dimensions without a change of design while allowing short bond wire lengths for each die size.

20 Claims, 4 Drawing Sheets

PACKAGING MEANS FOR A SEMICONDUCTOR DIE HAVING PARTICULAR SHELF STRUCTURE

FIELD OF THE INVENTION

This invention relates to packaging a semiconductor die. More specifically, means for packaging a die with either centrally or laterally located bond pads in a ceramic or plastic package without the use of a lead frame is described.

BACKGROUND OF THE INVENTION

Semiconductor die are most commonly manufactured with their bond pads laterally located along the edge of either end of the rectangular die. To package this type of die, the bottom (non-circuit side) of the completed die is enjoined with a lead frame or package by gluing, stuck on with a type of double-sided tape, adhered with metal (eutectic), by pressure bonding with metal, or by various other means.

After the die is adhered to the lead frame or package, bond wires are attached to the bond pads and to the lead frame. These bond wires are a bridge between the package leads of the lead frame and the die, thereby allowing the storage and retrieval of information from the die by the electrical device into which the packaged die is installed. The bond wires, which are manufactured from gold or aluminum, are kept as short as possible as long bond wires decrease component performance due to increased signal propagation delay. Cost is also a factor, especially when gold bond wires are used.

After attachment of the bond wires, the die is packaged in either a plastic or ceramic encapsulation material. Encapsulating the die protects it from damaging contact with foreign bodies and prevents light, which can affect the charge stored on the cell capacitors, from reaching the cells on the surface of the die.

One problem associated with the lead frame of this assembly is that as the design of the die is changed to reduce its size, the lead frame must be made smaller in order to keep the bond wires short. This can create a waste of materials after a die shrink has been implemented. It also requires a new lead frame to be designed and manufactured.

Another type of die, which has its die pads running lengthwise down the center of the rectangular die, is becoming more common in the semiconductor industry. This type of die is described in U.S. Pat. No. 4,82,245. A die with centrally located die pads provides a packaged semiconductor chip which has improved mechanical, electrical, and thermal performance. Also, since a die shrink doesn't greatly affect the positions of the die pads, shrinking the die doesn't require a redesigned lead frame. A related feature is that a die with this type of design allows the ends of the lead frame to come into closer proximity to the die pads. Shorter bond wires can be used, thus improving performance of the packaged semiconductor. Shorter bond wires also reduce the cost of the package due to the reduction of the amount of gold used.

Die with centrally located bond pads are packaged in much the same way as die with laterally located pads. To position the bond wire connection points on the lead frame as close as possible to the bond pads, thereby reducing the length of the bond wires, the lead frame is enjoined to the top (the circuit side) of the die. To prevent shorting of the die by the lead frame, a layer of passivation coats the surface of the die. The die is then wirebonded to the lead frame, and the assembly is encapsulated.

SUMMARY OF THE INVENTION

It is an object of this invention to provide die packaging means which does not require a lead frame.

Another object of this invention is to provide a die package design which requires no modification if the dimensions of the die received thereby are altered.

It is a further object of this invention to provide a die packaging design which can be used with either ceramic or plastic encapsulation material.

It is another object of the invention to provide a die packaging means with embodiments for die with either centrally located or laterally located die pads.

These objects of the present invention are accomplished by first fabricating a ceramic or plastic body having several shelves. The top shelf will receive a lid. In packages in which the lid is attached directly to the top of the chip package, the top surface is considered the first shelf.

The second shelf will have pads fabricated on the upper surface of the shelf for the attachment of bond wires. These pads will be electrically coupled with conductive traces fabricated within the body which will attach to input/output (I/O) leads.

Depending on the size of the traces within the body, the pads may also be larger than the traces manufactured into the body in order to better facilitate connection of a bond wire. The second shelf will have an area void of ceramic or plastic material so that bond wires can be attached from the traces on the top of the second shelf to the bond pads of the die. The shape and position of the void (or voids) will depend on whether the body is manufactured for a die with lateral or central die pads. The underside of the second shelf will receive the die, the die being attached to the underside of the second shelf with an adhesive or other workable attachment means. This attachment will require a layer of passivation on top of the die which is impervious to the attachment material. (A passivating layer of silicon nitride or silicon dioxide is normally fabricated on top of semiconductor die as a normal course of manufacture to protect the die from alpha particles and from damage during the encapsulation step.)

A third shelf will receive a package base manufactured from ceramic, plastic, or metal which will seal in and support the die. The metal base is especially useful when dissipating heat is a concern.

In a different embodiment, the die is attached directly to the package base, then the die and base as one unit is inserted into the body, thereby lessening the need for a passivating layer on top of the die. A passivating layer may still be desirable, depending on the possible damage to the die resulting from contact of the circuitry with foreign objects.

Various adhesives are required for use with the invention. In both the ceramic and plastic embodiments, there are attachments between the body and the lid, between the die and the body, and between the base and the body. In an alternate embodiment, which can be used with either a plastic or ceramic body, the die-body attachment is exchanged in favor of a die-base attachment. In addition, a ceramic body can have either a ceramic base or a metal base, depending on if the device requires additional protection from electromagnetic radiation above that provided by a ceramic base.

In the plastic body embodiment, either an epoxy or a polyimide material, both of which are known in the art, can be used with equal success for all connection points.

In ceramic embodiments, some sealing means are less costly but more reliable, and could be used in high-stress situations. Other lower cost adhesives will work for normal usages. Glass is one high reliability attachment means which can be used for all connection points. Another high reliability attachment means, which can be used on all connection points except for the die-base or die-body attachments, is solder. Polyimide and epoxy are two medium reliability attachment means usable with all connection points.

DETAILED DESCRIPTION OF THE PREFERRED EMBODIMENT

Figure 1:
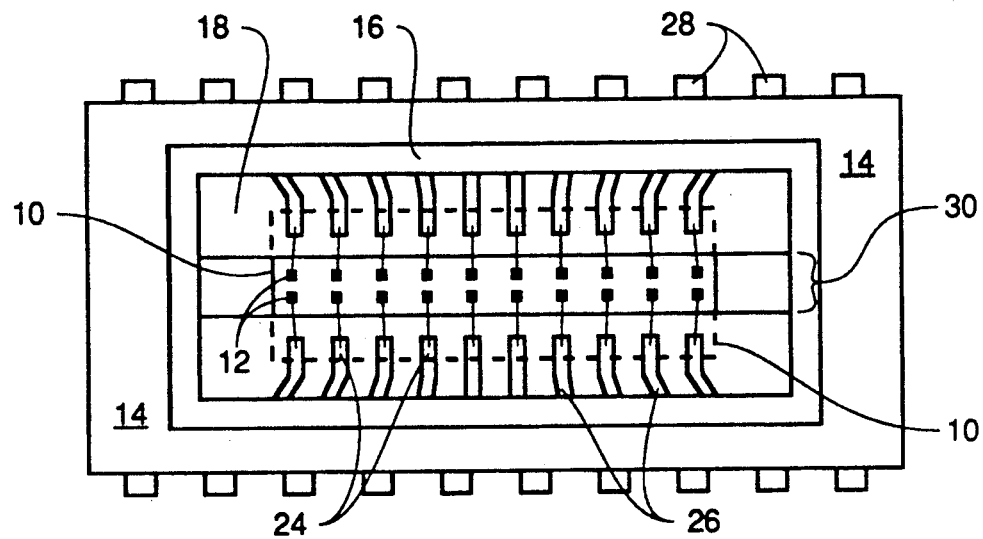
FIG. 1 shows a top view of a ceramic embodiment of the invention for use with a die having bond pads running lengthwise down the center.
Figure 2:
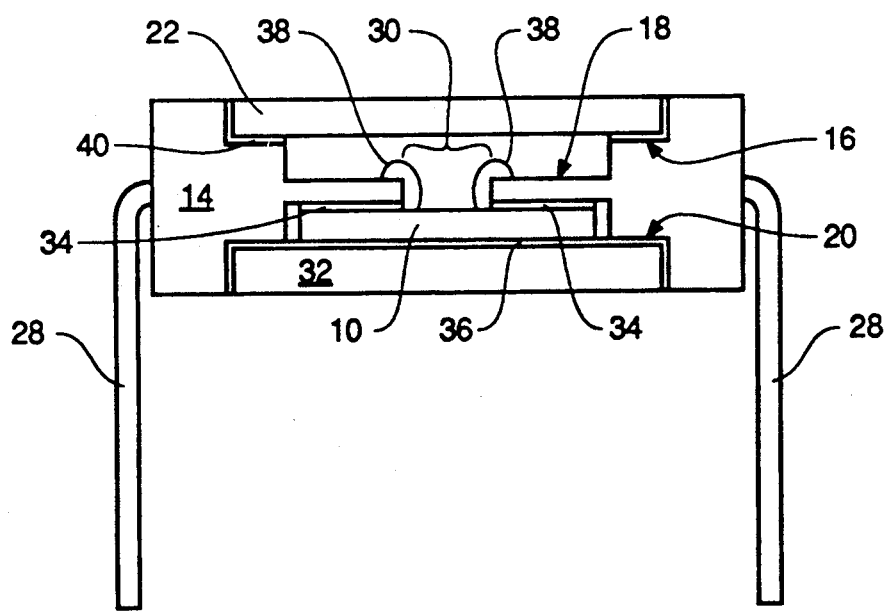
FIG. 2 shows a cross section of the embodiment of FIG. 1.

FIGS. 1 and 2 show a first embodiment of the invention for use with a die 10 having bond pads 12 running lengthwise down the center. A ceramic body 14 is manufactured with first 16, second 18, and third 20 shelves. The first shelf 16 receives a lid 22. (Note that the lid 22 is removed in FIG. 2 to show internal details of the invention.) The second shelf 18 contains bonding surfaces 24 and traces 26 on its top side, and receives the die 10 on the bottom side of the second shelf 18. The bonding surfaces 24 may be simply the terminal ends of the traces 26 as shown, or may be somewhat different in line width or material therefrom, but in any case are electrically coupled with the traces 26 manufactured into the ceramic body 14. The traces 26 have means for coupling with I/O leads 28 on the outside of the ceramic body 14, these means, such as by side brazing, being well known in the art.

Designs using a leadless chip carrier can also be employed. The second shelf 18 has two halves separated by a void 30 in the material of the second shelf 18 which runs lengthwise down the center of the second shelf 18 and allows the top half of the body 18 to be open to the bottom half. The inverted third shelf 20 receives a base 32, the base 32 hermetically sealing in the die 10, providing support therefor, and preventing the infusion of foreign substances such as moisture into the body 14 which could cause the die 10 to malfunction.

To assemble the package, the die 10 is attached to the underneath side of the second shelf 18 with an organic or glass attachment material 34. The bond pads 12 on the die 10 lie exposed at the void 30 of the second shelf 18, thereby allowing access to the bond pads 12 from the upper half of the body 14. The base 32 is then sealed to the bottom of the die 10 and to the third shelf 20 with a glass or metal attachment material 36. Bond wires 38 are attached to the bond pads 12 of the die 10 and to the bonding surfaces 24 on the top side of the second shelf 18. The lid 22 is then attached to the first shelf 16 with an adhesive 40, thereby hermetically sealing in the die 10.

Figure 3:
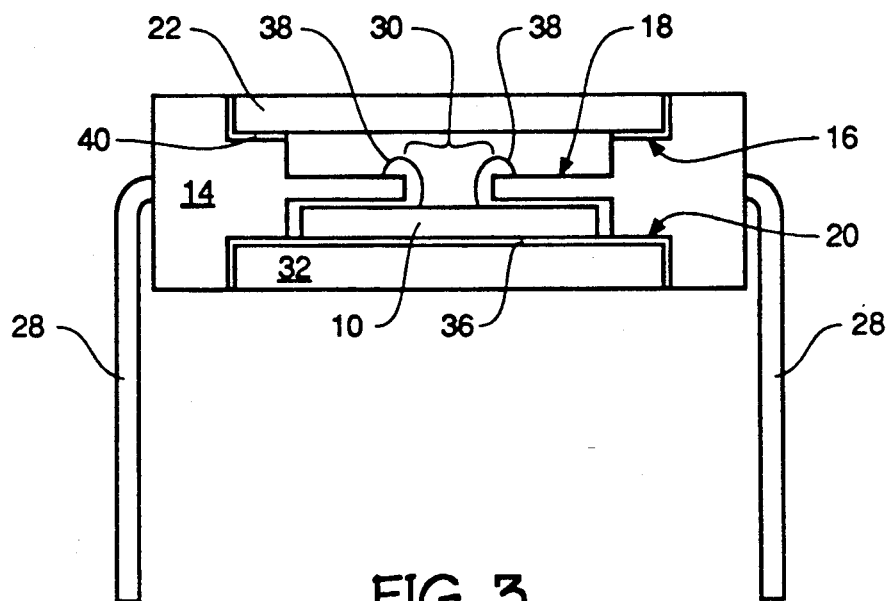
FIG. 3 shows a cross section of a ceramic embodiment of the invention similar to the FIG. 1 embodiment wherein the die is attached to the base, then the base and die are enjoined with the third shelf as a single assembly.

FIG. 3 shows an embodiment of the invention which is similar to that described in FIGS. 1 and 2. This embodiment has elements similar to those of the FIG. 1 embodiment, except that during assembly the die 10 is first attached to the base 32, and then the base 32 of the die-base assembly is received by the third shelf 20. At this step of assembly, the die 10 is free of any direct mechanical attachment to the second shelf 18, being supported by the base 32. The bond wires 38 are attached to the bond pads 12 on the die 10 and to the bonding surfaces 24 (which are electrically coupled to traces 26 manufactured into the body 14) on the top of the second shelf 18. The lid 22 is then attached to the first shelf 16 with an adhesive 40 thereby sealing in the die 10.

Figure 4:
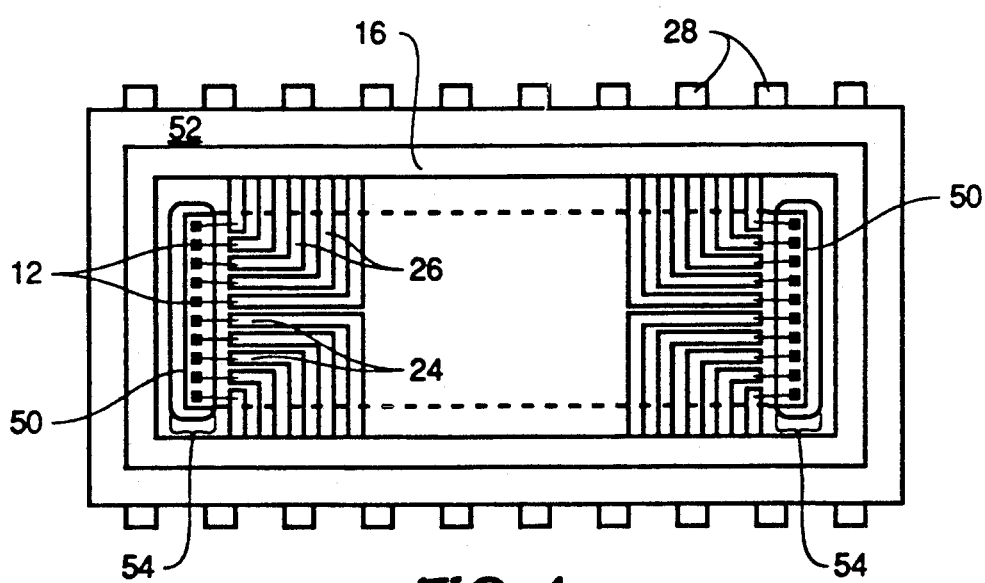
FIG. 4 shows an embodiment of the invention for use with a die having bond pads running widthwise on either end of the die.
Figure 5:
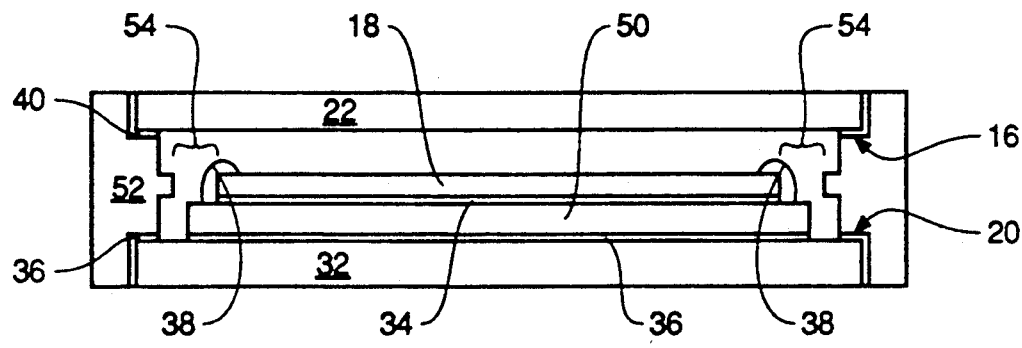
FIG. 5 shows a cross section of the embodiment of FIG. 4.

FIGS. 4 and 5 describe an embodiment of the invention for use with a die 50 having bond pads 12 running widthwise on either end of the die 50. A ceramic body 52 is manufactured with first 16, second 18, and third 20 shelves. The first shelf 16 is for receiving a lid 22. (Note that the lid 22 is removed in FIG. 5 to show internal details of the invention.) The second shelf 18 contains bonding surfaces 24 and traces 26 on its top side, and receives the die 50 on the underneath side of the second shelf 18. The bonding surfaces 24 may be simply the terminal ends of the traces 26 as shown, or may be somewhat different in width or material therefrom, but in any case are electrically coupled with the traces 26 manufactured into the ceramic body 52. The traces 26 have means for coupling with I/O leads 28 on the outside of the body 52, these means, such as by side brazing, being well known in the art. The second shelf 18 has two voids 54 therein at either end of the second shelf 18 which run widthwise across the body 52, the voids 54 thereby allowing the top half of the body 52 to be open to the bottom half at either end of the body 52. The inverted third shelf 20 receives a base 32, the base 32 hermetically sealing in the die 50, providing support therefor, and preventing the infusion of foreign substances such as moisture into the body 52 which could cause the die 50 to malfunction.

To assemble the package, the die 50 is attached to the underneath side of the second shelf 18 with an organic or glass attachment material 34. The bond pads 12 on the die 50 lie exposed at the two voids 54 of the second shelf 18, thereby allowing access to the bond pads 12 on either end of the die 50. The base 32 is then sealed to the bottom of the die 50 and to the inverted third 20 shelf with a glass or metal attachment material 36. Bond wires 38 are attached to the bond pads 12 of the die 50 and to the bonding surfaces 24 on the top side of the second shelf 18. The lid 22 is then attached to the first shelf 16 with an adhesive 40, thereby hermetically sealing in the die 50.

Figure 6:
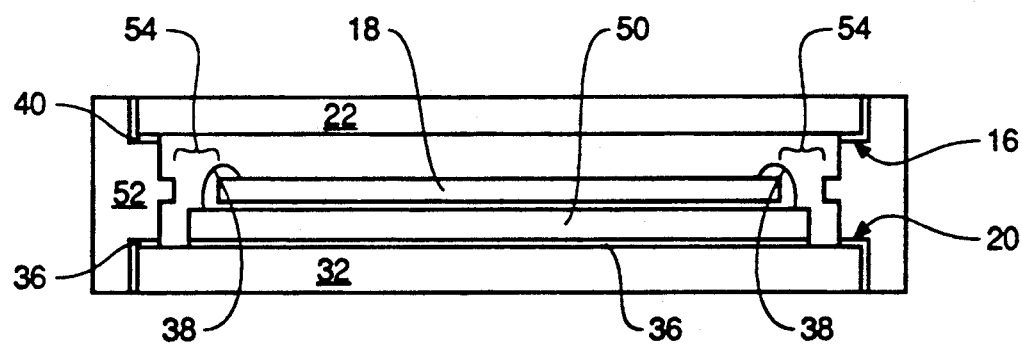
FIG. 6 shows a cross section of a ceramic embodiment of the invention similar to the FIG. 4 embodiment wherein the die is attached to the base, then the base and die are enjoined with the third shelf as a single assembly.

FIG. 6 shows an embodiment of the invention which is similar to that described in FIGS. 4 and 5, except that during assembly the die 50 is first attached to the base 32, and then the base 32 of the die-base assembly is received by the inverted third shelf 20. At this assembly step, the die 50 is free of any direct mechanical attachment to the second shelf 18. The bond wires 38 are attached to the bond pads 12 on the die 50 and to the bonding surfaces 24 on the top of the second shelf 18. The lid 22 is then attached to the first shelf 18 with an adhesive 40 thereby sealing the die 50 in the body 52.

Figure 7:
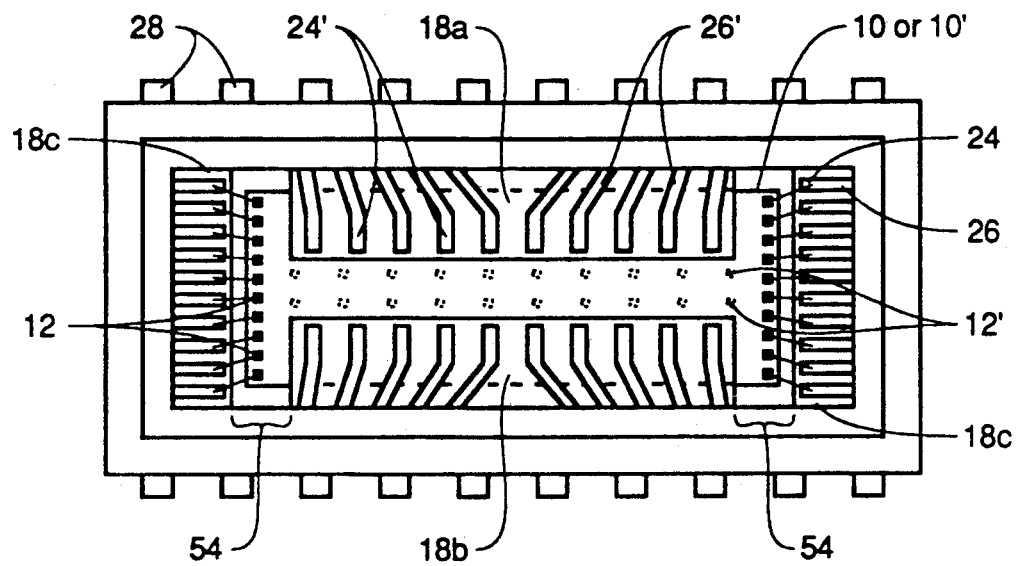
FIG. 7 shows a package body which may be used with either a die having bond pads running lengthwise down the center or widthwise at either end.
Figure 8:
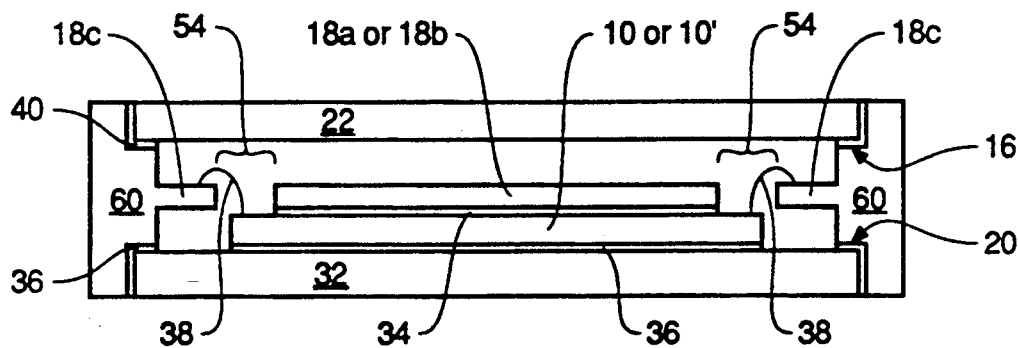
FIG. 8 shows a cross section of the FIG. 7 embodiment.

FIGS. 7 and 8 describe a "hybrid" body which may be used with either a die 10' having bond pads 12' running lengthwise down the center of the die 10' or with a die 10 having bond pads 12 running widthwise at either end. A first shelf 16 on the body 60 is for receiving a package lid 22 which will seal in the die 10, 10'. Note that the lid 22 is removed in FIG. 8 to show internal details of the invention. A second shelf 18 contains two sets of traces 26, 26', one set of traces 26' for use with a die 10' having centrally located bond pads 12', and the other set of traces 26 for use with a die 10 having laterally located bond pads 12.

The first set of traces 26' is located on the second shelf 18 on two planar members 18a, 18b which extend inward toward the lateral axis of the body 60 from each side of the body 60. These two planar members 18a, 18b are separated by a void 30 in the material which runs lengthwise down the center of the second shelf 18. The second set of traces 26 is located on two smaller areas of the second shelf 18c which extend along a portion of the width of the body 60 with one area on either end of the body 60.

Close to the second set of traces 26 are two voids 54 which allow connection of the bond pads 12 with the second set of bonding surfaces 24. The second set of bonding surfaces 24 is for die 10 with laterally located bond pads 12, and the first set of bonding surfaces 24', located on the planar members 18a, 18b, is for die 10' with centrally located bond pads 12'. The voids 30, 54 in the second shelf 18 allow the traces 12, 12' to be located as closely as possible to the bonding surfaces 24, 24', thereby allowing short bond wire 38 lengths. Both sets of traces 26, 26' have bonding surfaces 24, 24' for bonding with bond wires 38 which electrically couple the bond pads 12, 12' with the traces 26, 26'. An inverted third shelf 20 on the body 60 receives a base 32 which seals the die 10, 10' in the body 60 and prevents the infusion of foreign substances such as moisture into the body 60 which may cause the die 10, 10' to malfunction.

To assemble a die 10, 10' into the body 60 of the FIG. 7 embodiment, a die 10, 10' is received upon the underside of the second shelf 18. The circuit side of the die 10, 10' is attached to the shelf 18 with an adhesive material 34. A base 32 is then received by the inverted third shelf 20 and enjoined to the third shelf 18 with an adhesive 36, which also enjoins the base 32 with the bottom of the die 10, 10'. Bond wires 38 are connected to the bond pads 12, 12' on the die 10, 10' and to the bonding surfaces 24, 24' manufactured into the body. If the body 60 contains a die 10' with centrally located bond pads 12', the bond wires 38 connect the bond pads 12' to the first set of bonding surfaces 24' via the lengthwise void 30 which separates the two planar members 18a, 18b of the second shelf 18. If the body 60 contains a die 10 with laterally located bond pads 12, the bond wires 38 connect the bond pads 12 to the second set of bonding surfaces 24 via the lateral voids 54 at either end of the body 60.

Note that in an alternate embodiment which is not shown, the die 10, 10' could be attached to the base 32, and then the die-base assembly could be received by the third shelf 20, and enjoined therewith.

In all the ceramic embodiments described, some means for enjoining one element to another are necessary. Some of these enjoining means are very reliable but more costly, while others are less reliable but less costly. The reliable enjoining means could be used in high-stress environments, while other lower cost adhesives will work for normal usages. Glass is one high reliability attachment means which can be used for all connection points. Another high reliability attachment means, which can be used on all connection points except for the die-base or die-body attachments, is solder. Polyimide and epoxy are two medium reliability attachment means usable with all connection points.

In FIGS. 1 through 8, the base 32, instead of being manufactured from ceramic, can also be manufactured from a metal such as kelvar. This would better protect the die 10, 10', 50 from electromagnetic radiation present in the electronic device into which the package is installed, but at a greater cost. The metal base 32 could be joined to the third shelf 20 of the body 14, 52, 60 by any of the same materials that would join the ceramic base 32, namely solder, glass, polyimide, or epoxy.

Plastic embodiments of the invention are schematically identical to the ceramic embodiments described in FIG. 1 through FIG. 8, and differ from the ceramic descriptions only in the material from which they are made and the types of adhesives used to enjoin the various elements. In plastic embodiments of FIG. 1 through FIG. 8, the lid 22 and body 14, 52, 60, are plastic. The base 32 in the plastic embodiments can either be plastic or metal, a metal base better protecting the die from electromagnetic interference. The lid 22, body 14, 52, 60 and base 32 could all be joined to their respective shelves 16, 18, 20 with either epoxy or polyimide. In addition, the die-body or die-base attachments can also be accomplished through the use of either epoxy or polyimide.

What have been described are specific configurations of the invention, as applied to particular embodiments. Clearly, variations can be made to the original designs described in this document for adapting the invention to other embodiments. Therefore, the invention should be read as limited only by the appended claims.

I claim:

1. A body for receiving a semiconductor die, said body comprising:
   a) a first shelf for receiving a lid;
   b) a second shelf having conductive traces thereon, said second shelf overlying a portion of the semiconductor die, wherein said traces couple with bond pads on the semiconductor die;
   c) a third shelf for receiving a base; and
   d) conductive leads for electrically coupling with an electronic device, wherein said conductive leads electrically couple with said conductive traces.

2. The body of claim 1, wherein said second shelf contains a void, said void being located approximately above the bond pads of the semiconductor die, wherein a conductive material passes through said void to electrically couple said conductive traces with the bond pads on the semiconductor.

3. The body of claim 2, wherein said void bisects said second shelf.

4. The body of claim 2, wherein said conductive material comprises gold.

5. The body of claim 2, wherein said conductive material comprises aluminum.

6. The body of claim 1, wherein said second shelf has two voids, one void being located on either end of said second shelf approximately above the bond pads of the semiconductor die, wherein a conductive material passes through said voids to electrically couple said conductive traces with the bond pads on the semiconductor.

7. The body of claim 6, wherein said conductive material comprises gold.

8. The body of claim 6, wherein said conductive material comprises aluminum.

9. The body of claim 1 wherein said body is manufactured from a material comprising ceramic.

10. The body of claim 1 wherein said body is manufactured from a material comprising plastic.

11. A logic component comprising:
 a) a semiconductor die;
 b) a body for receiving said semiconductor die;
 c) a lid and a base receivable by said body;
 d) a first shelf for receiving said lid;
 e) a second shelf having conductive traces thereon, said second shelf overlying a portion of the semiconductor die, wherein said traces couple with bond pads on the semiconductor die;
 f) a third shelf for receiving said base; and
 g) conductive leads for electrically coupling with an electronic device, wherein said conductive leads electrically couple with said conductive traces.

12. The logic component of claim 1, wherein said second shelf contains a void, said void being located approximately above the bond pads of the semiconductor die, wherein a conductive material passes through said void to electrically couple said conductive traces with the bond pads on the semiconductor.

13. The logic component of claim 2, wherein said void bisects said second shelf.

14. The logic component of claim 2, wherein said conductive material comprises gold.

15. The logic component of claim 2, wherein said conductive material comprises aluminum.

16. The logic component of claim 1, wherein said second shelf has two voids, one void being located on either end of said second shelf approximately above the bond pads of the semiconductor die, wherein a conductive material passes through said voids to electrically couple said conductive traces with the bond pads on the semiconductor.

17. The logic component of claim 6, wherein said conductive material comprises gold.

18. The logic component of claim 6, wherein said conductive material comprises aluminum.

19. The logic component of claim 1 wherein said body is manufactured from a material comprising ceramic.

20. The logic component of claim 1 wherein said body is manufactured from a material comprising plastic.

* * * * *